United States Patent
Morishita et al.

(10) Patent No.: US 12,354,827 B2
(45) Date of Patent: Jul. 8, 2025

(54) ABERRATION CORRECTING DEVICE AND ELECTRON MICROSCOPE

(71) Applicant: JEOL Ltd., Tokyo (JP)

(72) Inventors: Shigeyuki Morishita, Tokyo (JP); Hidetaka Sawada, Tokyo (JP)

(73) Assignee: JEOL Ltd., Tokyo (JP)

(*) Notice: Subject to any disclaimer, the term of this patent is extended or adjusted under 35 U.S.C. 154(b) by 400 days.

(21) Appl. No.: 18/169,270

(22) Filed: Feb. 15, 2023

(65) Prior Publication Data

US 2023/0268155 A1    Aug. 24, 2023

(30) Foreign Application Priority Data

Feb. 22, 2022   (JP) .................................. 2022-025844

(51) Int. Cl.
  *H01J 37/153*   (2006.01)
  *H01J 37/28*    (2006.01)
(52) U.S. Cl.
  CPC ............ *H01J 37/153* (2013.01); *H01J 37/28* (2013.01)
(58) Field of Classification Search
  CPC ................................. H01J 37/153; H01J 37/28
  See application file for complete search history.

(56) References Cited

U.S. PATENT DOCUMENTS

| | | | |
|---|---|---|---|
| 6,852,983 B2* | 2/2005 | Matsuya | H01J 37/153 250/396 ML |
| 7,015,481 B2* | 3/2006 | Matsuya | H01J 37/28 250/398 |
| 7,211,804 B2* | 5/2007 | Yoshida | H01J 37/153 250/310 |
| 7,763,862 B2* | 7/2010 | Hosokawa | H01J 37/153 250/396 ML |
| 8,035,086 B2* | 10/2011 | Hirayama | H01J 3/12 369/112.26 |

(Continued)

FOREIGN PATENT DOCUMENTS

| | | | | |
|---|---|---|---|---|
| EP | 1914785 B1 * | 9/2016 | | H01J 37/153 |
| EP | 3518269 B1 * | 8/2020 | | H01J 37/153 |

(Continued)

OTHER PUBLICATIONS

Office Action issued in JP2022025844 on Jan. 30, 2024.

*Primary Examiner* — David A Vanore
(74) *Attorney, Agent, or Firm* — The Webb Law Firm (57) ABSTRACT

An aberration correcting device includes a first multipole which generates a hexapole field; a second multipole which generates a hexapole field with a polarity opposite to a polarity of the hexapole filed generated by the first multipole; a third multipole which is disposed between the first multipole and the second multipole and generates an octupole field; a first transfer lens system disposed between the first multipole and the third multipole; and a second transfer lens system disposed between the third multipole and the second multipole. The first transfer lens system includes a plurality of fourth multipoles which generate a field in which an electromagnetic-field superposed quadrupole field and an octupole field are superposed; and the second transfer lens system includes a plurality of fifth multipoles which generate a field in which an electromagnetic-field superposed quadrupole field and an octupole field are superposed.

8 Claims, 7 Drawing Sheets

(56) References Cited

U.S. PATENT DOCUMENTS

| | | | | |
|---|---|---|---|---|
| 8,785,880 | B2* | 7/2014 | Sawada | H01J 37/26 250/311 |
| 2006/0145097 | A1* | 7/2006 | Parker | H01J 37/3174 250/492.22 |
| 2009/0032709 | A1* | 2/2009 | Sawada | H01J 37/26 250/311 |
| 2012/0193533 | A1* | 8/2012 | Zach | H01J 37/153 250/396 ML |
| 2014/0158901 | A1* | 6/2014 | Sawada | H01J 37/26 250/396 R |
| 2015/0029593 | A1* | 1/2015 | Sawada | G01N 23/20 359/637 |
| 2016/0225576 | A1* | 8/2016 | Kohno | H01J 37/141 |
| 2019/0157057 | A1* | 5/2019 | Stewart | H01J 49/0468 |
| 2019/0180973 | A1* | 6/2019 | Henstra | H01J 37/147 |
| 2019/0228945 | A1* | 7/2019 | Sawada | H01J 37/153 |
| 2025/0112016 | A1* | 4/2025 | Henstra | H01J 37/153 |

FOREIGN PATENT DOCUMENTS

| | | |
|---|---|---|
| JP | 200954565 A | 3/2009 |
| JP | 2014116219 A | 6/2014 |
| JP | 2016134295 A | 7/2016 |
| JP | 2019129073 A | 8/2019 |
| WO | 2019021455 A1 | 1/2019 |

\* cited by examiner

ABERRATION CORRECTING DEVICE AND ELECTRON MICROSCOPE

CROSS-REFERENCE TO RELATED APPLICATION

This application claims priority to Japanese Patent Application No. 2022-025844, filed Feb. 22, 2022, the disclosure of which is hereby incorporated by reference in its entirety.

BACKGROUND OF THE INVENTION

Field of the Invention

The present invention relates to an aberration correcting device and an electron microscope.

In electron microscopes such as a transmission electron microscope (TEM), a scanning electron microscope (SEM) and the like, aberration correction is an important art in acquiring high resolution images.

Description of Related Art

JP-A-2009-54565 discloses a spherical aberration correcting device capable of removing high-order aberration while spherical aberration is corrected by using three-stage three-fold symmetric field (three-fold symmetric magnetic field or three-fold symmetric electric field).

JP-A-2014-116219 discloses an optical system which corrects chromatic aberration by using two-stage quadrupole field superposing an electromagnetic field (quadrupole field in which an electric quadrupole field and a magnetic quadrupole field are superposed).

JP-A-2019-129073 discloses an aberration correcting device capable of correcting both spherical aberration and chromatic aberration by using an optical system for chromatic aberration correction for a transfer lens system of a geometric-aberration correcting device.

In an electron microscope, in order to make observation with higher resolution, an aberration correcting device capable of correcting high-order aberration is in demand.

SUMMARY OF THE INVENTION

According to a first aspect of the present disclosure, there is provided an aberration correcting device including:
a first multipole which generates a hexapole field;
a second multipole which generates a hexapole field with a polarity opposite to a polarity of the hexapole field generated by the first multipole;
a third multipole which is disposed between the first multipole and the second multipole and generates an octupole field;
a first transfer lens system disposed between the first multipole and the third multipole; and
a second transfer lens system disposed between the third multipole and the second multipole,
the first transfer lens system including a plurality of fourth multipoles which generate a field in which an electromagnetic-field superposed quadrupole field and an octupole field are superposed; and
the second transfer lens system including a plurality of fifth multipoles which generate a field in which an electromagnetic-field superposed quadrupole field and an octupole field are superposed.

According to a second aspect of the present disclosure, there is provided an electron microscope including the above aberration correcting device.

DESCRIPTION OF THE INVENTION

According to an embodiment of the present disclosure, there is provided an aberration correcting device including:
a first multipole which generates a hexapole field;
a second multipole which generates a hexapole field with a polarity opposite to a polarity of the hexapole field generated by the first multipole;
a third multipole which is disposed between the first multipole and the second multipole and generates an octupole field;
a first transfer lens system disposed between the first multipole and the third multipole; and
a second transfer lens system disposed between the third multipole and the second multipole,
the first transfer lens system including a plurality of fourth multipoles which generate a field in which an electromagnetic-field superposed quadrupole field and an octupole field are superposed; and
the second transfer lens system including a plurality of fifth multipoles which generate a field in which an electromagnetic-field superposed quadrupole field and an octupole field are superposed.

In the aberration correcting device as above, the first transfer lens system includes a plurality of fourth multipoles which generate a field in which an electromagnetic-field superposed quadrupole field and an octupole are superposed, and the second transfer lens system includes a plurality of fifth multipoles which generate a field in which an electromagnetic-field superposed quadrupole field and an octupole field are superposed and thus, fifth-order aberration can be corrected.

According to an embodiment of the present disclosure, there is provided an electron microscope including the above aberration correcting device.

Preferred embodiments of the invention will be described in detail below with reference to the figures. It is noted that the embodiments described below do not unduly limit the scope of the invention described in the claims. In addition, all of the components described below are not necessarily essential requirements of the invention.

1. First Embodiment

1.1 Aberration Correcting Device

Figure 1:
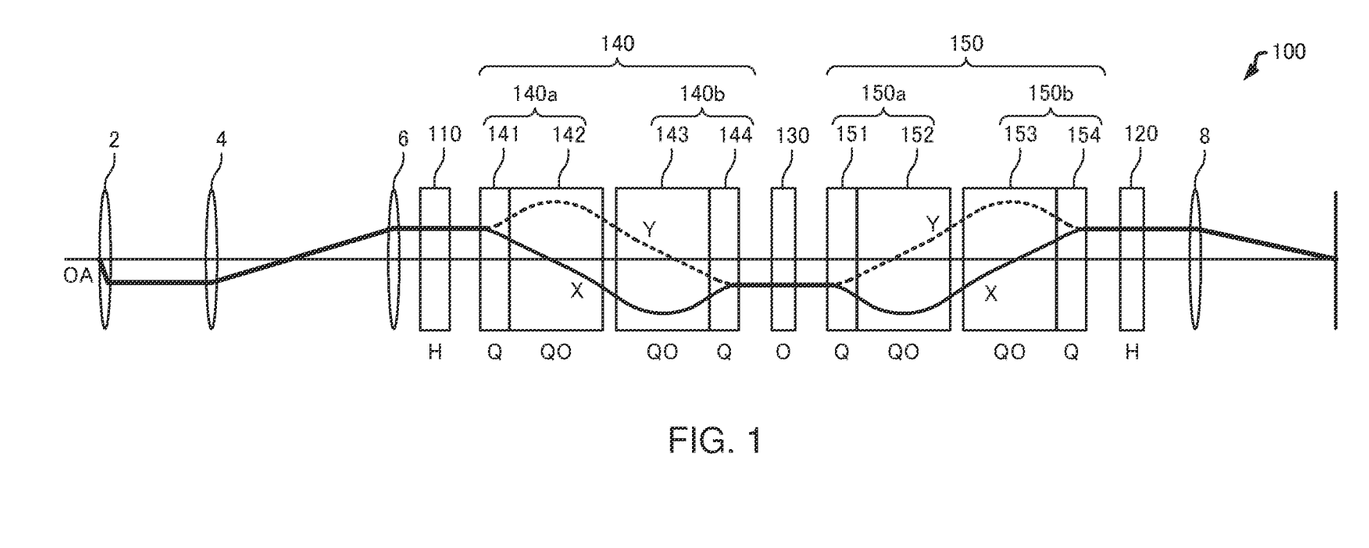
FIG. 1 is a diagram illustrating a configuration of an aberration correcting device according to the first embodiment.

First, an aberration correcting device according to the first embodiment will be explained by referring to drawings. FIG. 1 is a diagram illustrating a configuration of an aberration correcting device 100 according to the first embodiment. In FIG. 1, a case in which the aberration correcting device 100 is incorporated in an image-forming system of an electron microscope is illustrated. It is to be noted that, in FIG. 1, symbols indicating a field generated by each of the multipoles are illustrated, and "H" denotes a hexapole field, "Q" for a quadrupole field, and "QO" for a superposed field of a quadrupole field and an octupole field.

The aberration correcting device 100 is, as illustrated in FIG. 1, incorporated in the image-forming system of the electron microscope. The aberration correcting device 100 corrects spherical aberration and chromatic aberration of the image-forming system (objective lens 2). In an illustrated example, a transfer lens 4 and a transfer lens 6 are disposed between an objective lens 2 and the aberration correcting device 100. Moreover, the aberration correcting device 100 is disposed between the objective lens 2 and a projection lens 8.

The aberration correcting device 100 includes, as illustrated in FIG. 1, a first multipole 110, a second multipole 120, a third multipole 130, a first transfer lens system 140, and a second transfer lens system 150.

The first multipole 110 and the second multipole 120 are disposed along an optical axis OA. The optical axis OA passes a center of the first multipole 110 and a center of the second multipole 120. The first multipole 110 and the second multipole 120 are disposed away from each other in a direction along the optical axis OA. In the aberration correcting device 100, the first multipole 110 and the second multipole 120 are disposed in this order in an advancing direction of an electron beam.

The first multipole 110 generates a hexapole field (a magnetic-field hexapole field or an electric-field hexapole field). The hexapole field is three-fold symmetric. The second multipole 120 generates a hexapole field with a polarity opposite to that of the hexapole field generated by the first multipole 110. In the aberration correcting device 100, by means of generation of two-stage the hexapole field by the first multipole 110 and the second multipole 120, spherical aberration of the image-forming system is corrected.

The first multipole 110 and the second multipole 120 are hexapoles or dodecapoles, for example. It is to be noted that the first multipole 110 and the second multipole 120 only need to generate the hexapole field, and the number of poles is not particularly limited.

The third multipole 130 is disposed between the first multipole 110 and the second multipole 120. The third multipole 130 generates an octupole field (a magnetic-field octupole field or an electric-field octupole field). The octupole field is four-fold symmetric.

The third multipole 130 is an octupole, for example. It is to be noted that the third multipole 130 only needs to be capable of generating an octupole field, and the number of poles is not limited.

The first transfer lens system 140 is disposed between the first multipole 110 and the third multipole 130. The second transfer lens system 150 is disposed between the third multipole 130 and the second multipole 120. Since orbits of the electron beam are separate to an X-direction and a Y-direction in the first transfer lens system 140 and the second transfer lens system 150, FIG. 1 illustrates an X-orbit, which is a typical orbit in the X-direction of the electron beam, and a Y-orbit, which is a typical orbit in the Y-direction of the electron beam. An X-axis and a Y-axis are axes perpendicular to the optical axis OA and are orthogonal to each other.

The first transfer lens system 140 transfers an image equivalent to an image acquired by the first multipole 110 to the third multipole 130. The third multipole 130 is disposed at a position conjugate to the first multipole 110. Moreover, the second transfer lens system 150 transfers an image equivalent to an image acquired by the third multipole 130 to the second multipole 120. By means of the first transfer lens system 140 and the second transfer lens system 150, an optical distance between the first multipole 110 and the second multipole 120 becomes zero. Thus, a physical distance can be provided between the first multipole 110 and the second multipole 120.

The first transfer lens system 140 includes a plurality of multipoles. In the illustrated example, the first transfer lens system 140 includes four multipoles (a first transfer multipole 141, a second transfer multipole 142, a third transfer multipole 143, a fourth transfer multipole 144). The first transfer multipole 141, the second transfer multipole 142, the third transfer multipole 143, and the fourth transfer multipole 144 are disposed along the optical axis OA.

The first transfer multipole 141 generates an electromagnetic-field superposed quadrupole field. The electromagnetic-field superposed quadrupole field is a quadrupole field in which an electric-field quadrupole field and a magnetic-field quadrupole field are superposed. The electromagnetic-field superposed quadrupole field is two-fold symmetric.

Figure 2:
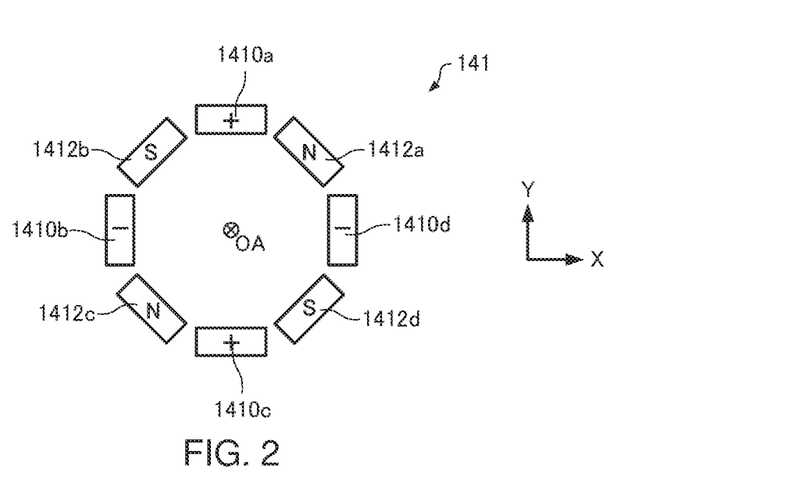
FIG. 2 is a plan view schematically illustrating a first transfer multipole.

FIG. 2 is a plan view schematically illustrating the first transfer multipole 141.

The first transfer multipole 141 has a plurality of electrodes and a plurality of magnetic poles regularly arrayed around the optical axis OA. In the illustrated example, the first transfer multipole 141 has quadrupolar electrodes 1410$a$, 1410$b$, 1410$c$, 1410$d$ and quadrupolar magnetic poles 1412$a$, 1412$b$, 1412$c$, 1412$d$ arrayed around the optical axis OA.

The quadrupolar electrodes 1410$a$, 1410$b$, 1410$c$, 1410$d$ are disposed at 90° each on a plane (XY plane) perpendicular to the optical axis OA. Absolute values of applied voltage applied to each of the quadrupolar electrodes 1410$a$, 1410$b$, 1410$c$, 1410$d$ are equal to one another. However, in the quadrupolar electrodes 1410$a$, 1410$b$, 1410$c$, 1410$d$, polarities of the adjacent electrodes are opposite to each other. The quadrupolar electrodes 1410$a$, 1410$b$, 1410$c$, 1410$d$ generate the electric-field quadrupole fields.

The quadrupolar magnetic poles 1412$a$, 1412$b$, 1412$c$, 1412$d$ are disposed at 90° each on a plane perpendicular to the optical axis OA. The magnetic pole 1412$a$ has an exciting coil (not shown) with a winding number N attached thereto so that a current I flows though this exciting coil. Therefore, a magnetomotive force of the magnetic pole 1412a is NI. Regarding the magnetic poles 1412b, 1412c, 1412d, too, the exciting coils are attached similarly to the magnetic pole 1412a.

The exciting coils attached to the quadrupolar magnetic poles 1412a, 1412b, 1412c, 1412d are individually connected to a current source (not shown), and their magnetomotive force can be set arbitrarily. In the illustrated example, the magnetomotive force of the quadrupolar magnetic poles 1412a, 1412b, 1412c, 1412d is equal to one another. However, in the quadrupolar magnetic poles 1412a, 1412b, 1412c, 1412d, polarities of the adjacent magnetic poles are opposite to each other. The quadrupolar magnetic poles 1412a, 1412b, 1412c, 1412d generate the magnetic-field quadrupole field.

Figure 3:
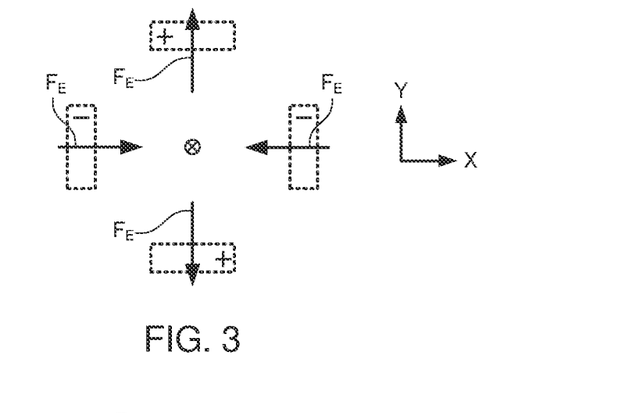
FIG. 3 is a diagram for explaining a force received by an electron beam from an electric-field quadrupole field.

FIG. 3 is a diagram for explaining a force received by the electron beam from the electric-field quadrupole field generated by the quadrupolar electrodes 1410a, 1410b, 1410c, 1410d.

As illustrated in FIG. 3, the electric-field quadrupole field generated by the quadrupolar electrodes 1410a, 1410b, 1410c, 1410d has a converging action in the X-direction and has a diverging action in the Y-direction with respect to the electron beam. Therefore, when the electron beam receives a force $F_E$ from the electric-field quadrupole field, it converges in the X-direction and diverges in the Y-direction.

Figure 4:
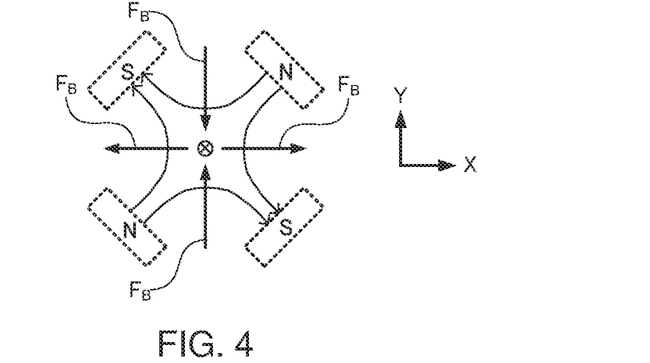
FIG. 4 is a diagram for explaining a force received by an electron beam from a magnetic-field quadrupole field.

FIG. 4 is a diagram for explaining a force received by the electron beam from the magnetic-field quadrupole field generated by the quadrupolar magnetic poles 1412a, 1412b, 1412c, 1412d.

As illustrated in FIG. 4, the magnetic-field quadrupole field generated by the quadrupolar magnetic poles 1412a, 1412b, 1412c, 1412d has a diverging action in the X-direction and has a converging action in the Y-direction with respect to the electron beam. Therefore, when the electron beam receives a force $F_B$ from the magnetic-field quadrupole field, it diverges in the X-direction and converges in the Y-direction.

In the first transfer multipole 141, the electric-field quadrupole field and the magnetic-field quadrupole field are superposed so as to generate an electromagnetic-field superposed quadrupole field. In the first transfer multipole 141, a force $F_E$ received by the electron beam by the two-fold symmetric electric field and the force $F_B$ received by the electron beam by the two-fold symmetric magnetic field are applied in a direction offsetting each other.

In the example in FIG. 1, for the first transfer multipole 141, the electric-field quadrupole field is set stronger than the magnetic-field quadrupole field. That is, in the first transfer multipole 141, the force $F_E$ received by the electron beam by the electric-field quadrupole field is set larger than the force $F_B$ received by the electron beam by the magnetic-field quadrupole field ($F_B<F_E$). As a result, a two-fold astigmatic component is given to the electron beam, and the orbit is changed. Specifically, the first transfer multipole 141 gives a component in the diverging direction of the two-fold astigmatism to the Y-orbit of the electron beam and a component in the converging direction of the two-fold astigmatism to the X-orbit of the electron beam as illustrated in FIG. 1.

Moreover, the first transfer multipole 141 has a thickness with respect to the advancing direction of the electron beam. More specifically, the first transfer multipole 141 has a thickness generated by combination aberration by a field by a high-order term other than a primary term of a multipole field. The first transfer multipole 141 causes the electron beam to generate a concave-lens action by the combination aberration.

Here, the combination aberration is combination aberration generated by combination of aberration 1 and aberration 2, that is, when aberration generated at a certain spot (the aberration 1) propagates for a certain distance, whereby an incident point is changed, and another aberration (the aberration 2) is affected.

The second transfer multipole 142 generates an electromagnetic-field superposed quadrupole field. The second transfer multipole 142 has a quadrupolar electrode and a quadrupolar magnetic pole arrayed around the optical axis OA. The arrangement of the quadrupolar electrode and the quadrupolar magnetic pole of the second transfer multipole 142 is the same as that of the first transfer multipole 141 illustrated in FIG. 2.

In the example in FIG. 1, in the second transfer multipole 142, the magnetic-field quadrupole field is set stronger than the electric-field quadrupole field. That is, in the second transfer multipole 142, the force $F_B$ received by the electron beam by the magnetic-field quadrupole field is set larger than the force $F_E$ received by the electron beam by the electric-field quadrupole field ($F_E<F_B$). As a result, the second transfer multipole 142 generates a two-fold astigmatic component with a sign opposite to that of the two-fold astigmatic component generated in the first transfer multipole 141. The second transfer multipole 142 gives, as illustrated in FIG. 1, a component in the converging direction of the two-fold astigmatism to the Y-orbit of the electron beam and a component in the diverging direction of the two-fold astigmatism to the X-orbit of the electron beam.

Moreover, the second transfer multipole 142 has a thickness with respect to the advancing direction of the electron beam similar to the first transfer multipole 141. The second transfer multipole 142 causes the electron beam to generate a convex-lens action by the combination aberration.

The third transfer multipole 143 generates an electromagnetic-field superposed quadrupole field. The third transfer multipole 143 has a quadrupolar electrode and a quadrupolar magnetic pole arrayed around the optical axis OA. The arrangement of the quadrupolar electrode and the quadrupolar magnetic pole of the third transfer multipole 143 has a polarity opposite to that of the first transfer multipole 141 illustrated in FIG. 2. That is, the third transfer multipole 143 is the one obtained by rotating the first transfer multipole 141 illustrated in FIG. 2 by 90°.

In the third transfer multipole 143, the magnetic-field quadrupole field is set stronger than the electric-field quadrupole field. That is, in the third transfer multipole 143, the force $F_B$ received by the electron beam by the magnetic-field quadrupole field is set larger than the force $F_E$ received by the electron beam by the electric-field quadrupole field ($F_E<F_B$). As a result, the third transfer multipole 143 gives, as illustrated in FIG. 1, a component in the diverging direction of the two-fold astigmatism to the Y-orbit of the electron beam and a component in the converging direction of the two-fold astigmatism to the X-orbit of the electron beam.

Moreover, the third transfer multipole 143 has a thickness with respect to the advancing direction of the electron beam. The third transfer multipole 143 causes the electron beam to generate the concave-lens action by the combination aberration.

The fourth transfer multipole 144 generates an electromagnetic-field superposed quadrupole field. The fourth transfer multipole 144 has a quadrupolar electrode and a quadrupolar magnetic pole arrayed around the optical axis OA. The arrangement of the quadrupolar electrode and the quadrupolar magnetic pole of the fourth transfer multipole 144 has the same as that of the third transfer multipole 143.

In the fourth transfer multipole 144, the electric-field quadrupole field is set stronger than the magnetic-field quadrupole field. That is, in the fourth transfer multipole 144, the force $F_E$ received by the electron beam by the electric-field quadrupole field is set larger than the force $F_B$ received by the electron beam by the magnetic-field quadrupole field ($F_B < F_E$). As a result, the fourth transfer multipole 144 generates a two-fold astigmatic component with a sign opposite to that of the two-fold astigmatic component generated in the third transfer multipole 143. Specifically, the fourth transfer multipole 144 gives, as illustrated in FIG. 1, a component in the converging direction of the two-fold astigmatism to the Y-orbit of the electron beam and a component in the diverging direction of the two-fold astigmatism to the X-orbit of the electron beam.

Moreover, the fourth transfer multipole 144 has a thickness with respect to the advancing direction of the electron beam. The fourth transfer multipole 144 causes the electron beam to generate the convex-lens action by the combination aberration.

In the first transfer lens system 140, by combining the concave-lens action generated by the first transfer multipole 141, the convex-lens action generated by the second transfer multipole 142, the concave-lens action generated by the third transfer multipole 143, and the convex-lens action generated by the fourth transfer multipole 144, negative chromatic aberration is generated.

The first transfer multipole 141 and the second transfer multipole 142 configure a first optical system 140a. The first optical system 140a generates a first electromagnetic field. The first electromagnetic field is formed by an electromagnetic-field superposed quadrupole field generated by the first transfer multipole 141 and the electromagnetic-field superposed quadrupole field generated by the second transfer multipole 142.

The third transfer multipole 143 and the fourth transfer multipole 144 configure a second optical system 140b. The second optical system 140b generates a second electromagnetic field obtained by rotating the first electromagnetic field around the optical axis OA by 90°. The orbit of the electron beam in the second multipole 120 is an orbit obtained by rotating the orbit of the electron beam in the first multipole 110 around the optical axis OA by 90°. In the first transfer lens system 140, chromatic two-fold astigmatic component generated in the first optical system 140a can be cancelled by the chromatic two-fold astigmatic component generated in the second optical system 140b.

The second transfer lens system 150 is an optical system obtained by rotating the first transfer lens system 140 by 90°. The second transfer lens system 150 generates an electromagnetic field obtained by rotating the electromagnetic field generated by the first transfer lens system 140 around the optical axis OA by 90°. As illustrated in FIG. 1, the orbit of the electron beam in the second transfer lens system 150 and the orbit of the electron beam in the first transfer lens system 140 are symmetric.

The second transfer lens system 150 has four transfer multipoles similarly to the first transfer lens system 140. Specifically, the second transfer lens system 150 has a fifth transfer multipole 151, a sixth transfer multipole 152, a seventh transfer multipole 153, and an eighth transfer multipole 154. The fifth transfer multipole 151 and the sixth transfer multipole 152 configure a first optical system 150a, and the seventh transfer multipole 153 and the eighth transfer multipole 154 configure a second optical system 150b. The fifth transfer multipole 151, the sixth transfer multipole 152, the seventh transfer multipole 153, and the eighth transfer multipole 154 are disposed along the optical axis OA.

The fifth transfer multipole 151 generates an electromagnetic-field superposed quadrupole field. The sixth transfer multipole 152 generates an electromagnetic-field superposed quadrupole field with the same polarity as that of the fifth transfer multipole 151. The seventh transfer multipole 153 generates an electromagnetic-field superposed quadrupole field with the polarity opposite to that of the fifth transfer multipole 151. The eighth transfer multipole 154 generates an electromagnetic-field superposed quadrupole field with the same polarity as that of the seventh transfer multipole 153.

Here, the second transfer multipole 142 of the first transfer lens system 140 generates an octupole field in addition to the electromagnetic-field superposed quadrupole field. That is, the second transfer multipole 142 generates a field in which the electromagnetic-field superposed quadrupole field and the octupole field are superposed.

Similarly, the third transfer multipole 143 of the first transfer lens system 140 generates an octupole field in addition to the electromagnetic-field superposed quadrupole field. That is, the third transfer multipole 143 generates a field in which the electromagnetic-field superposed quadrupole field and the octupole field are superposed.

Similarly, the sixth transfer multipole 152 of the second transfer lens system 150 generates an octupole field in addition to the electromagnetic-field superposed quadrupole field. That is, the sixth transfer multipole 152 generates a field in which the electromagnetic-field superposed quadrupole field and the octupole field are superposed.

Similarly, the seventh transfer multipole 153 of the second transfer lens system 150 generates an octupole field in addition to the electromagnetic-field superposed quadrupole field. That is, the seventh transfer multipole 153 generates a field in which the electromagnetic-field superposed quadrupole field and the octupole field are superposed.

All the octupole field generated by the second transfer multipole 142, the octupole field generated by the third transfer multipole 143, the octupole field generated by the third multipole 130, the octupole field generated by the sixth transfer multipole 152, and the octupole field generated by the seventh transfer multipole 153 have the same polarity (same direction).

As long as the first transfer multipole 141, the fourth transfer multipole 144, the fifth transfer multipole 151, and the eighth transfer multipole 154 can generate an electromagnetic-field superposed quadrupole field, the number of poles thereof is not limited. As long as the second transfer multipole 142, the third transfer multipole 143, the sixth transfer multipole 152, and the seventh transfer multipole 153 can generate a field in which an electromagnetic-field superposed quadrupole field and an octupole field are superposed, the number of poles thereof is not limited.

1.2. Operation

Subsequently, an operation of the aberration correcting device 100 will be explained.

Spherical Aberration

In the aberration correcting device 100, by using negative spherical aberration generated by a hexapole field having a thickness along the advancing direction of the electron beam, that is, a thickness along the optical axis OA, the spherical aberration of the image-forming system (objective lens 2) is corrected. Specifically, in the aberration correcting device 100, a two-stage hexapole field is generated by the first multipole 110 and the second multipole 120, whereby the negative spherical aberration is generated, and positive spherical aberration of the image-forming system is cancelled. As a result, the spherical aberration of the image-forming system can be corrected.

Three-Fold Astigmatism

The polarity of the hexapole field generated by the first multipole 110 is opposite to the polarity of the hexapole field generated by the second multipole 120. Thus, the three-fold astigmatism generated by the hexapole field generated by the first multipole 110 is cancelled by the hexapole field generated by the second multipole 120. Therefore, in the aberration correcting device 100, the three-fold astigmatism can be corrected.

Chromatic Aberration

In the aberration correcting device 100, negative chromatic aberration is generated by the combination aberration in the first transfer lens system 140 and the second transfer lens system 150. In the aberration correcting device 100, the positive chromatic aberration of the image-forming system is cancelled by the negative chromatic aberration generated in the first transfer lens system 140 and the second transfer lens system 150. As a result, the chromatic aberration of the image-forming system can be corrected.

Fourth-Order Coma Aberration, Five-Fold Astigmatism

In the aberration correcting device 100, the first transfer lens system 140 and the second transfer lens system 150 are disposed between the first multipole 110 and the second multipole 120. Thus, in the aberration correcting device 100, between the first multipole 110 and the second multipole 120, the number of transfers becomes two and thus, fourth-order coma aberration of one-fold symmetry and five-fold astigmatism of five-fold symmetry can be corrected.

Six-Fold Astigmatism

In the aberration correcting device 100, as described above, in order to correct spherical aberration, the first multipole 110 and the second multipole 120 generate a hexapole field. In the aberration correcting device 100, derived from the hexapole field generated by these first multipole 110 and second multipole 120, six-fold astigmatism can occur.

Here, the six-fold astigmatism can be generated as combination aberration of star aberration and four-fold astigmatism.

The star aberration is third-order geometric aberration and two-fold symmetric. The star aberration can be generated from the quadrupole field. Therefore, the star aberration can be generated by the quadrupole field generated by the second transfer multipole 142, the quadrupole field generated by the third transfer multipole 143, the quadrupole field generated by the sixth transfer multipole 152, and the quadrupole field generated by the seventh transfer multipole 153.

It is to be noted that the second transfer multipole 142, the third transfer multipole 143, the sixth transfer multipole 152, and the seventh transfer multipole 153 can generate a quadrupole field for chromatic aberration correction and spherical aberration correction as described above. Therefore, there is no need to provide a new pole for generating a quadrupole field in the second transfer multipole 142, the third transfer multipole 143, the sixth transfer multipole 152, and the seventh transfer multipole 153 in order to generate star aberration.

The four-fold astigmatism can be generated from an octupole field. Therefore, the four-fold astigmatism can be generated by an octupole field generated by the second transfer multipole 142, an octupole field generated by the third transfer multipole 143, an octupole field generated by the sixth transfer multipole 152, and an octupole field generated by the seventh transfer multipole 153.

As described above, by generating the star aberration and the four-fold astigmatism in the second transfer multipole 142, the third transfer multipole 143, the sixth transfer multipole 152, and the seventh transfer multipole 153, the six-fold astigmatism can be generated as the combination aberration of the star aberration and the four-fold astigmatism.

In the aberration correcting device 100, the six-fold astigmatism generated by the second transfer multipole 142, the third transfer multipole 143, the sixth transfer multipole 152, and the seventh transfer multipole 153 cancels the six-fold astigmatism derived from a hexapole field generated by the first multipole 110 and the second multipole 120. As a result, in the aberration correcting device 100, the six-fold astigmatism can be corrected.

It is to be noted that, by correcting the six-fold astigmatism as above, excess four-fold astigmatism is generated in the second transfer multipole 142, the third transfer multipole 143, the sixth transfer multipole 152, and the seventh transfer multipole 153. This excess four-fold astigmatism can be corrected by an octupole field generated by the third multipole 130.

1.3 Effect

In the aberration correcting device 100, by a hexapole field generated by the first multipole 110 and the hexapole field generated by the second multipole 120, negative spherical aberration is generated. Thus, in the aberration correcting device 100, the positive spherical aberration of the image-forming system can be cancelled by the negative spherical aberration generated by the first multipole 110 and the second multipole 120. Therefore, in the aberration correcting device 100, the spherical aberration can be corrected.

In the aberration correcting device 100, an electromagnetic-field superposed quadrupole field generated by a plurality of the multipoles configuring the first transfer lens system 140 and an electromagnetic-field superposed quadrupole field generated by a plurality of the multipoles configuring the second transfer lens system 150 generate the negative chromatic aberration. Thus, in the aberration correcting device 100, the positive chromatic aberration of the image-forming system can be cancelled by the negative chromatic aberration generated by the first transfer lens system 140 and the second transfer lens system 150. Therefore, in the aberration correcting device 100, the chromatic aberration can be corrected.

In the aberration correcting device 100, the chromatic aberration can be corrected by the optical system used in the transfer lens system. Therefore, in the aberration correcting device 100, as compared with a case in which the spherical aberration correction and the chromatic aberration correction are conducted by connecting a spherical aberration correcting device and a chromatic aberration correcting device in a tandem manner, for example, size reduction of the device can be promoted.

The aberration correcting device 100 includes the first transfer lens system 140 disposed between the first multipole 110 and the third multipole 130 and the second transfer lens system 150 disposed between the third multipole 130 and the second multipole 120. The first transfer lens system 140 includes a plurality of the fourth multipoles (the second transfer multipole 142 and the third transfer multipole 143) which generate a field in which the electromagnetic-field superposed quadrupole field and the octupole field are superposed, and the second transfer lens system 150 includes a plurality of the fifth multipoles (the sixth transfer multipole 152 and the seventh transfer multipole 153) which generate a field in which the electromagnetic-field superposed quadrupole field and the octupole field are superposed. Thus, in the aberration correcting device 100, as described above, the six-fold astigmatism can be corrected.

In the aberration correcting device 100, the star aberration is generated by the quadrupole field generated by the second transfer multipole 142, the quadrupole field generated by the third transfer multipole 143, the quadrupole field generated by the sixth transfer multipole 152, and the quadrupole field generated by the seventh transfer multipole 153. Moreover, the four-fold astigmatism is generated by the octupole field generated by the second transfer multipole 142, the octupole field generated by the third transfer multipole 143, the octupole field generated by the sixth transfer multipole 152, and the octupole field generated by the seventh transfer multipole 153. The six-fold astigmatism is generated as the combination aberration of the star aberration and the four-fold astigmatism.

Therefore, in the aberration correcting device 100, the six-fold astigmatism derived from the hexapole field generated by the first multipole 110 and the second multipole 120 can be cancelled by the six-fold astigmatism generated by the second transfer multipole 142, the third transfer multipole 143, the sixth transfer multipole 152, and the seventh transfer multipole 153. Therefore, in the aberration correcting device 100, the six-fold astigmatism can be corrected. In the aberration correcting device 100, the four-fold astigmatism generated by generating the six-fold astigmatism by the second transfer multipole 142, the third transfer multipole 143, the sixth transfer multipole 152, and the seventh transfer multipole 153 is corrected by the octupole field generated by the third multipole 130. As described above, in the aberration correcting device 100, the four-fold astigmatism can be corrected.

2. Second Embodiment

2.1 Aberration Correcting Device

Figure 5:
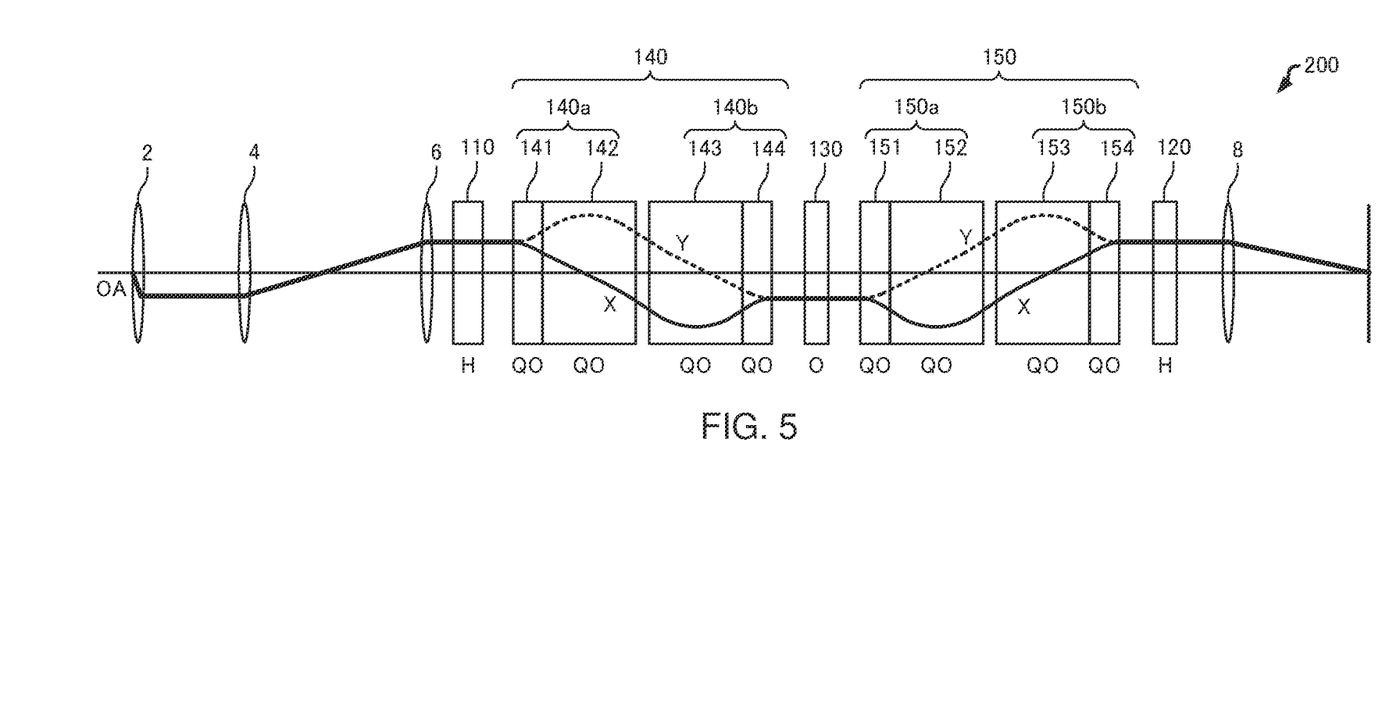
FIG. 5 is a diagram illustrating a configuration of an aberration correcting device according to the second embodiment.

Subsequently, an aberration correcting device according to the second embodiment will be explained by referring to drawings. FIG. 5 is a diagram illustrating a configuration of an aberration correcting device 200 according to the second embodiment. Hereinafter, in the aberration correcting device 200 according to the second embodiment, a member having a function similar to a constituent member of the aberration correcting device 100 according to the first embodiment is given the same sign, and detailed explanation thereof will be omitted. In the aberration correcting device 100 in FIG. 1 described above, the six-fold astigmatism was corrected by using the second transfer multipole 142, the third transfer multipole 143, the sixth transfer multipole 152, and the seventh transfer multipole 153.

On the other hand, in the aberration correcting device 200, the six-fold astigmatism is corrected by using the second transfer multipole 142, the third transfer multipole 143, the sixth transfer multipole 152, and the seventh transfer multipole 153, and the fifth-order star aberration is corrected by using the first transfer multipole 141, the fourth transfer multipole 144, the fifth transfer multipole 151, and the eighth transfer multipole 154.

That is, in the aberration correcting device 200, the second transfer multipole 142, the third transfer multipole 143, the sixth transfer multipole 152, and the seventh transfer multipole 153 function as multipoles for six-fold astigmatism correction for correcting the six-fold astigmatism, and the first transfer multipole 141, the fourth transfer multipole 144, the fifth transfer multipole 151, and the eighth transfer multipole 154 function as multipoles for the fifth-order star aberration correction for correcting the fifth-order star aberration.

In the aberration correcting device 200, the first transfer multipole 141 generates an octupole field in addition to the electromagnetic-field superposed quadrupole field. Similarly, the fourth transfer multipole 144 generates an octupole field in addition to the electromagnetic-field superposed quadrupole field. Similarly, the fifth transfer multipole 151 generates an octupole field in addition to the electromagnetic-field superposed quadrupole field. Similarly, the eighth transfer multipole 154 generates an octupole field in addition to the electromagnetic-field superposed quadrupole field.

All the octupole field generated by the first transfer multipole 141, the octupole field generated by the second transfer multipole 142, the octupole field generated by the third transfer multipole 143, the octupole field generated by the fourth transfer multipole 144, the octupole field generated by the fifth transfer multipole 151, the octupole field generated by the sixth transfer multipole 152, the octupole field generated by the seventh transfer multipole 153, the octupole field generated by the eighth transfer multipole 154, and the octupole field generated by the third multipole 130 have the same polarity (same direction).

2.2. Operation

In the aberration correcting device 200, similarly to the aberration correcting device 100, spherical aberration, chromatic aberration, three-fold astigmatism, fourth-order coma aberration, five-fold astigmatism, six-fold astigmatism, and four-fold astigmatism can be corrected. Moreover, in the aberration correcting device 200, the fifth-order star aberration can be corrected.

Derived from the hexapole field generated by the first multipole 110 and the second multipole 120, the six-fold astigmatism is generated. Moreover, derived from the electromagnetic-field superposed transfer quadrupole field generated by the first transfer lens system 140 and the second transfer lens system 150, fifth-order star aberration is generated. In the aberration correcting device 100 described above, the six-fold astigmatism can be corrected by using the second transfer multipole 142, the third transfer multipole 143, the sixth transfer multipole 152, and the seventh transfer multipole 153, but the fifth-order star aberration cannot be corrected.

Here, the fifth-order star aberration can be generated as combination aberration of the star aberration and the four-fold astigmatism similarly to the six-fold astigmatism described above.

The star aberration can be generated from a quadrupole field. Therefore, the star aberration can be generated by the quadrupole field generated by the first transfer multipole 141, the quadrupole field generated by the fourth transfer multipole 144, the quadrupole field generated by the fifth transfer multipole 151, and the quadrupole field generated by the eighth transfer multipole 154.

It is to be noted that the first transfer multipole 141, the fourth transfer multipole 144, the fifth transfer multipole 151, and the eighth transfer multipole 154 can generate a quadrupole field for the chromatic aberration correction and the spherical aberration correction as described above. Therefore, there is no need to provide a new pole for generating a quadrupole field in the first transfer multipole 141, the fourth transfer multipole 144, the fifth transfer multipole 151, and the eighth transfer multipole 154 in order to generate the star aberration.

The four-fold astigmatism can be generated from an octupole field. Therefore, the four-fold astigmatism can be generated by the octupole field generated by the first transfer multipole 141, the octupole field generated by the fourth transfer multipole 144, the octupole field generated by the fifth transfer multipole 151, and the octupole field generated by the eighth transfer multipole 154.

As described above, by generating the star aberration and the four-fold astigmatism in the first transfer multipole 141, the fourth transfer multipole 144, the fifth transfer multipole 151, and the eighth transfer multipole 154, the fifth-order star aberration as combination aberration of the star aberration and the four-fold astigmatism can be generated.

In the aberration correcting device 200, the fifth-order star aberration generated by the first transfer multipole 141, the fourth transfer multipole 144, the fifth transfer multipole 151, and the eighth transfer multipole 154 cancels the fifth-order star aberration derived from the electromagnetic-field superposed transfer quadrupole field generated by the first transfer lens system 140 and the second transfer lens system 150. As a result, in the aberration correcting device 200, the fifth-order star aberration can be corrected.

In the aberration correcting device 200, the fifth-order star aberration is corrected by using multipoles different from the second transfer multipole 142, the third transfer multipole 143, the sixth transfer multipole 152, and the seventh transfer multipole 153 used for six-fold astigmatism correction (the first transfer multipole 141, the fourth transfer multipole 144, the fifth transfer multipole 151, and the eighth transfer multipole 154). Therefore, in the aberration correcting device 200, the fifth-order star aberration can be corrected while a state in which the six-fold astigmatism is corrected is maintained.

2.3. Effect

In the aberration correcting device 200, similarly to the aberration correcting device 100, spherical aberration, chromatic aberration, three-fold astigmatism, fourth-order coma aberration, five-fold astigmatism, six-fold astigmatism, and four-fold astigmatism can be corrected. Moreover, in the aberration correcting device 200, the fifth-order star aberration can be corrected.

In the aberration correcting device 200, the second transfer multipole 142, the third transfer multipole 143, the sixth transfer multipole 152, and the seventh transfer multipole 153 are used as multipoles for six-fold astigmatism correction, and the first transfer multipole 141, the fourth transfer multipole 144, the fifth transfer multipole 151, and the eighth transfer multipole 154 are used as multipoles for the fifth-order star aberration correction. Therefore, in the aberration correcting device 200, the fifth-order star aberration can be corrected while the state in which the six-fold astigmatism is corrected is maintained.

3. Third Embodiment

Figure 6:
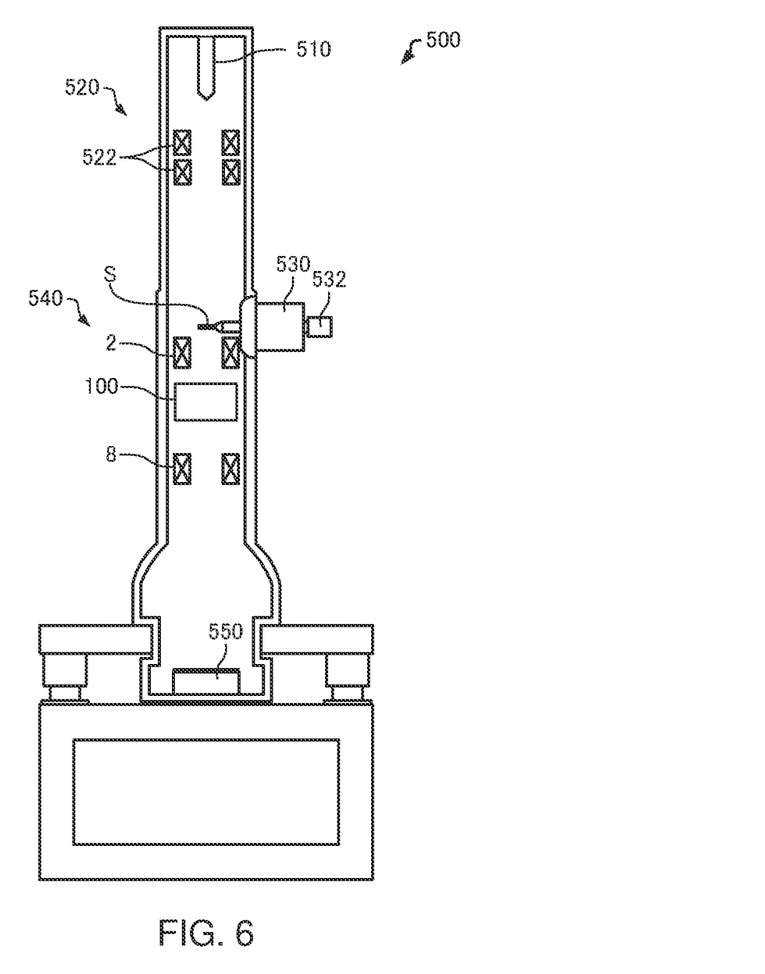
FIG. 6 is a diagram illustrating a configuration of an electron microscope according to the third embodiment.

Subsequently, an electron microscope according to the third embodiment will be explained by referring to drawings. FIG. 6 is a diagram illustrating a configuration of an electron microscope 500 according to the third embodiment.

The electron microscope 500 includes the aberration correcting device 100. The electron microscope 500 is a transmission electron microscope (TEM) in which the aberration correcting device 100 is incorporated in an image-forming system 540. The electron microscope 500 includes, as illustrated in FIG. 6, an electron source 510, an irradiation system 520, a sample stage 530, the image-forming system 540, and a detector 550.

The electron source 510 emits electron beams. The electron source 510 is an electron gun which accelerates, in an anode, electrons emitted from a cathode and emits the electron beams, for example.

The irradiation system 520 emits the electron beams emitted from the electron source 510 to a sample S. For example, the irradiation system 520 emits a parallel beam to an observation region. The irradiation system 520 includes a plurality of condenser lenses 522. The condenser lens 522 converges the electron beams emitted from the electron source 510. Though not shown, the irradiation system 520 may include a lens other than the condenser lens 522, a diaphragm and the like.

The sample stage 530 supports the sample S held by a sample holder 532. By means of the sample stage 530, the sample S can be positioned.

The image-forming system 540 is an optical system for forming an image by the electron beam transmitted through the sample S. The image-forming system 540 includes the objective lens 2 and the projection lens 8. The objective lens 2 is a lens of a first stage for forming a TEM image by the electron beam transmitted through the sample S. The projection lens 8 further enlarges the image formed by the objective lens 2 and forms an image on the detector 550. As illustrated in FIG. 1, between the objective lens 2 and the aberration correcting device 100, the transfer lens 4 and the transfer lens 6 are disposed.

The aberration correcting device 100 is incorporated in the image-forming system 540. The aberration correcting device 100 corrects aberration of the image-forming system 540 (objective lens 2).

The detector 550 detects electrons transmitted through the sample S. The detector 550 takes up an image formed by the image-forming system 540. The detector 550 is a digital camera such as a CCD (Charge Coupled Device) camera.

In the electron microscope 500, the electron beams emitted from the electron source 510 are converged in the irradiation system 520 and emitted to the sample S. In the observation region of the sample S, parallel beams, for example, are emitted. The electron beams transmitted through the sample S form an image of a transmission electron microscope image (TEM image) by the image-forming system 540. The TEM image is taken up by the detector 550. In the electron microscope 500, the aberration of the image-forming system 540 can be corrected by the aberration correcting device 100 and thus, a TEM image with high resolution can be acquired.

4. Fourth Embodiment

Figure 7:
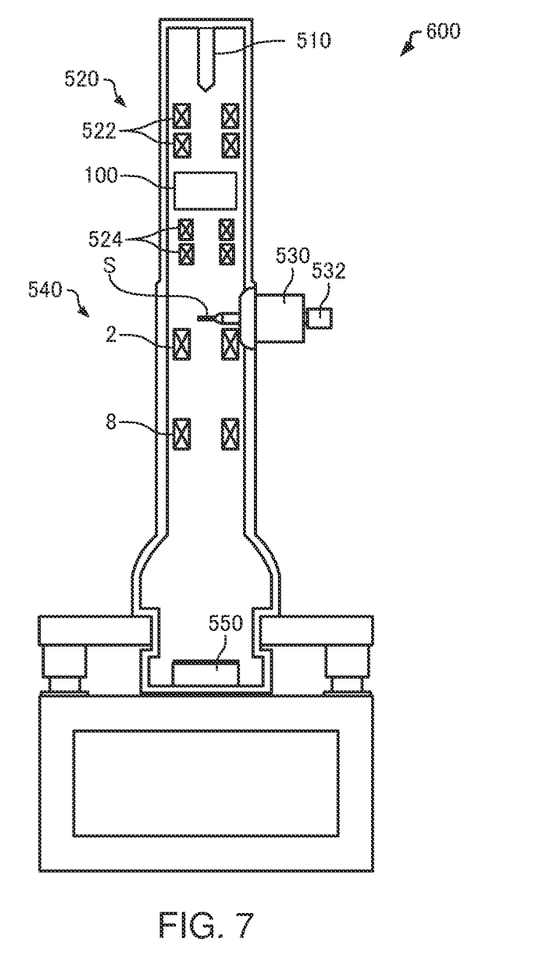
FIG. 7 is a diagram illustrating a configuration of an electron microscope according to the fourth embodiment.
Figure 8:
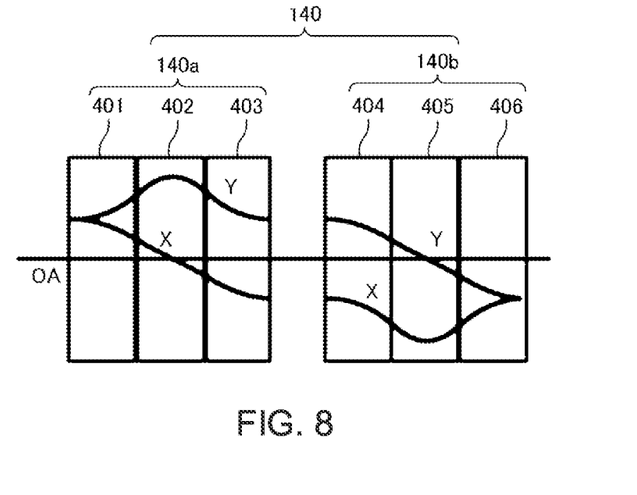
FIG. 8 is a diagram illustrating a modification of the first transfer lens system.
Figure 9:
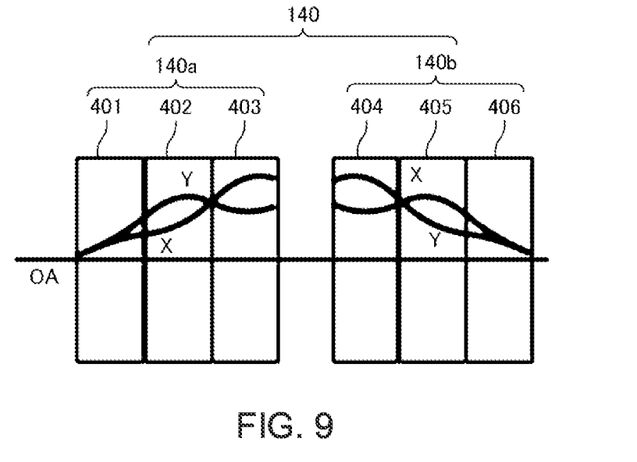
FIG. 9 is a diagram illustrating a modification of the first transfer lens system.
Figure 10:
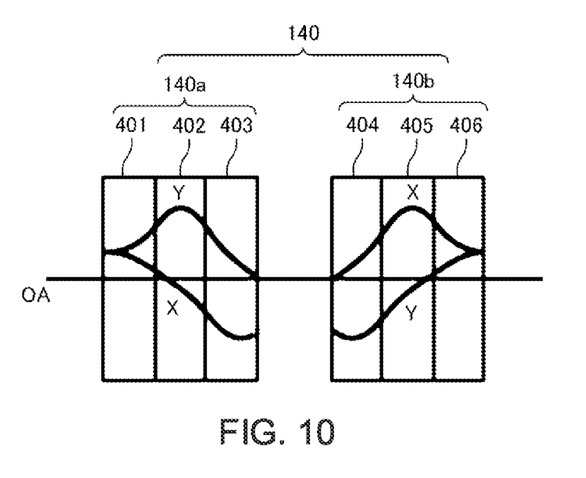
FIG. 10 is a diagram illustrating a modification of the first transfer lens system.
Figure 11:
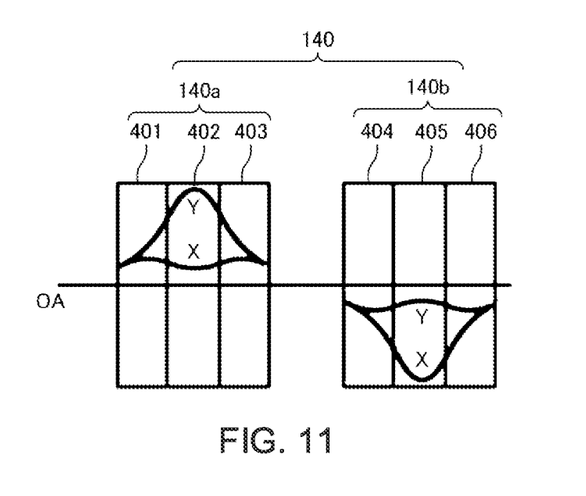
FIG. 11 is a diagram illustrating a modification of the first transfer lens system.

Subsequently, an electron microscope according to the fourth embodiment will be explained by referring to drawings. FIG. 7 is a diagram illustrating a configuration of an electron microscope 600 according to the fourth embodiment. Hereinafter, in the electron microscope 600 according to the fourth embodiment, a member having a function similar to a constituent member of the electron microscope 500 according to the third embodiment is given the same sign, and detailed explanation thereof will be omitted.

The electron microscope 500 in FIG. 6 described above is a transmission electron microscope (TEM) in which the aberration correcting device 100 is incorporated in the image-forming system 540, but the electron microscope 600 is, as illustrated in FIG. 7, a scanning transmission electron microscope (STEM) in which the aberration correcting device 100 is incorporated in the irradiation system 520.

The irradiation system 520 converges the electron beams emitted from the electron source 510, forms an electron probe, and scans the sample S by the electron probe. The irradiation system 520 includes a plurality of the condenser lenses 522 and a deflector 524.

The plurality of condenser lenses 522 converge the electron beams emitted from the electron source 510 and form the electron probe. It is to be noted that a magnetic field formed by the objective lens 2 in front of the sample S functions as a lens for forming the electron probe together with the condenser lens 522.

The deflector 524 two-dimensionally deflects the converged electron beams. By deflecting the electron beams by the deflector 524, the samples S can be scanned by the electron probe.

The aberration correcting device 100 is incorporated in the irradiation system 520. The aberration correcting device 100 corrects aberration of the irradiation system 520 (condenser lens 522).

The image-forming system 540 leads the electron beams transmitted through the sample S to the detector 550. The detector 550 may be a dark-field STEM detector which detects the electrons inelastically scattered by the sample S at a high angle with an annular detector or may be a bright-field STEM detector which detects transmitted waves transmitted through the sample S and emitted in the same direction as incident electron beams.

In the electron microscope 600, the electron beams emitted from the electron source 510 are converged by the irradiation system 520 and form the electron probe. The electron probe is two-dimensionally deflected by the deflector 524. As a result, the sample S can be scanned by the electron probe. The electron beams transmitted through the sample S is led to the detector 550 by the image-forming system 540 and are detected by the detector 550. For example, by detecting the electrons transmitted on the sample S by the detector 550 synchronously with the scanning by the electron probe, a scanning-transmission electron microscope image (STEM image) can be acquired. The electron microscope 600 includes the aberration correcting device 100 and thus, a STEM image with high resolution can be acquired.

5. Modifications

The invention is not limited to the embodiments described above, and various modifications can be made within the scope of the invention.

FIGS. 8 to 11 are diagrams illustrating modifications of the first transfer lens system 140.

In the aberration correcting device 100 according to the first embodiment described above, as illustrated in FIG. 1, the first transfer lens system 140 is configured by the four multipoles (the first transfer multipole 141, the second transfer multipole 142, the third transfer multipole 143, the fourth transfer multipole 144), but the number of multipoles configuring the first transfer lens system 140 is not particularly limited.

As illustrated in FIGS. 8 to 11, the first transfer lens system 140 may be configured by six multipoles (a first transfer multipole 401, a second transfer multipole 402, a third transfer multipole 403, a fourth transfer multipole 404, a fifth transfer multipole 405, a sixth transfer multipole 406).

The six multipoles illustrated in FIGS. 8 to 11 generate an electromagnetic-field superposed quadrupole, respectively, similarly to the four multipoles in FIG. 1. As a result, negative chromatic aberration can be generated.

Moreover, the two multipoles in the six multipoles illustrated in FIGS. 8 to 11 may function as multipoles for six-fold astigmatism correction, and the two multipoles in the six multipoles may function as multipoles for fifth-order star aberration correction.

Moreover, as the orbit of the electron beams at the transfer by the first transfer lens system 140, as illustrated in FIGS. 8 to 11, various orbits can be adopted.

Though not shown, as described above, the second transfer lens system 150 is an optical system obtained by rotating the first transfer lens system 140 by 90°.

The same applies to the aberration correcting device 200 according to the second embodiment described above, the number of multipoles configuring the first transfer lens system 140 is not particularly limited, and various orbits can be adopted as the orbit of the electron beams at the transfer by the first transfer lens system 140.

The invention is not limited to the above-described embodiments, and various modifications are possible. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

The invention claimed is:

1. An aberration correcting device comprising:
a first multipole which generates a hexapole field;
a second multipole which generates a hexapole field with a polarity opposite to a polarity of the hexapole field generated by the first multipole;
a third multipole which is disposed between the first multipole and the second multipole and generates an octupole field;
a first transfer lens system disposed between the first multipole and the third multipole; and
a second transfer lens system disposed between the third multipole and the second multipole,
wherein the first transfer lens system includes a plurality of fourth multipoles which generate a field in which an electromagnetic-field superposed quadrupole field and an octupole field are superposed; and
wherein the second transfer lens system includes a plurality of fifth multipoles which generate a field in which an electromagnetic-field superposed quadrupole field and an octupole field are superposed.

2. The aberration correcting device according to claim 1, wherein
   star aberration is generated by a quadrupole field generated by each of the plurality of fourth multipoles and a quadrupole field generated by each of the plurality of fifth multipoles;
   four-fold astigmatism is generated by an octupole field generated by each of the plurality of fourth multipoles and an octupole field generated by each of the plurality of fifth multipoles; and
   six-fold astigmatism is generated as combination aberration of the star aberration and the four-fold astigmatism.

3. The aberration correcting device according to claim 2, wherein
   four-fold astigmatism generated by generating six-fold astigmatism by the first transfer lens system and the second transfer lens system is corrected by an octupole field generated by the third multipole.

4. The aberration correcting device according to claim 1, wherein
   star aberration is generated by a quadrupole field generated by each of the plurality of fourth multipoles and a quadrupole field generated by each of the plurality of fifth multipoles;
   four-fold astigmatism is generated by an octupole field generated by each of the plurality of fourth multipoles and an octupole field generated by each of the plurality of fifth multipoles; and
   fifth-order star aberration is generated as combination aberration of the star aberration and the four-fold astigmatism.

5. The aberration correcting device according to claim 1, wherein
   star aberration for six-fold astigmatism correction is generated by a quadrupole field generated by a fourth multipole for six-fold astigmatism correction among the plurality of fourth multipoles and a quadrupole field generated by a fifth multipole for six-fold astigmatism correction among the plurality of fifth multipoles;
   four-fold astigmatism for six-fold astigmatism correction is generated by an octupole field generated by the fourth multipole for six-fold astigmatism correction and an octupole field generated by the fifth multipole field generated by the fifth multipole for six-fold astigmatism correction;
   six-fold astigmatism is generated as combination aberration of the star aberration for six-fold astigmatism correction and the four-fold astigmatism for six-fold astigmatism correction;
   star aberration for fifth-order star aberration correction is generated by a quadrupole field generated by the fourth multipole for fifth-order star aberration correction among the plurality of fourth multipoles and a quadrupole field generated by the fifth multipole for fifth-order star aberration correction among the plurality of fifth multipoles;
   four-fold astigmatism for fifth-order star aberration correction is generated by an octupole field generated by the fourth multipole for fifth-order star aberration correction and an octupole field generated by the fifth multipole for fifth-order star aberration correction; and
   fifth-order star aberration is generated as combination aberration of the star aberration for fifth-order star aberration correction and the four-fold astigmatism for fifth-order star aberration correction.

6. The aberration correcting device according to claim 1, wherein
   negative spherical aberration is generated by a hexapole field generated by the first multipole and a hexapole field generated by the second multipole.

7. The aberration correcting device according to claim 1, wherein
   negative chromatic aberration is generated by an electromagnetic-field superposed quadrupole field generated by each of the plurality of fourth multipoles and an electromagnetic-field superposed quadrupole field generated by each of the plurality of fifth multipoles.

8. An electron microscope comprising the aberration correcting device according to claim 1.

* * * * *